(12) United States Patent
Greim et al.

(10) Patent No.: US 7,164,333 B2
(45) Date of Patent: Jan. 16, 2007

(54) STANDING WAVE BARRIER

(75) Inventors: Helmut Greim, Adelsdorf (DE);
Jürgen Hagen, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 53 days.

(21) Appl. No.: 11/084,422

(22) Filed: Mar. 18, 2005

(65) Prior Publication Data

US 2005/0231300 A1   Oct. 20, 2005

(30) Foreign Application Priority Data

Mar. 18, 2004   (DE) .................. 10 2004 013 424

(51) Int. Cl.
*H01P 3/02* (2006.01)
*H01P 5/04* (2006.01)
*H01P 1/04* (2006.01)

(52) U.S. Cl. .................. 333/244; 333/1; 333/24 C
(58) Field of Classification Search .................. 333/1, 333/24 C, 236, 237, 243, 244, 254, 260
See application file for complete search history.

(56) References Cited

U.S. PATENT DOCUMENTS

| | | | |
|---|---|---|---|
| 4,695,810 A * | 9/1987 | Heckaman et al. | ............. 333/1 |
| 4,851,793 A * | 7/1989 | Heckaman et al. | ............. 333/1 |
| 5,124,677 A * | 6/1992 | Heckaman et al. | ......... 333/236 |
| 5,247,270 A * | 9/1993 | Harman et al. | ............. 333/237 |
| 6,822,846 B1 | 11/2004 | Reykowski | |
| 7,075,385 B1 * | 7/2006 | Haunberger et al. | .......... 333/35 |

FOREIGN PATENT DOCUMENTS

| DE | 83 18 583 | 1/1987 |
|---|---|---|
| DE | 196 27 027 | 8/1997 |

* cited by examiner

*Primary Examiner*—Dean Takaoka
(74) *Attorney, Agent, or Firm*—Schiff Hardin LLP

(57) ABSTRACT

A standing wave barrier for at least one radio frequency cable having a cable axis has at least one metallic base web that proceeds parallel to the cable axis from a first web end to a second web end. The web ends are coupled to one another in terms of radio frequency terms via a capacitance, so that the base web and the capacitance together form a radio frequency resonant oscillator circuit. The base web and the capacitance are situated in one of two half-shells that can be connected to one another such that the radio frequency cable is clamped between them. The capacitance has an adjustable capacitor element that has a first capacitor surface and a second capacitor surface. The first capacitor surface is connected in electrically conductive fashion to the first web end, and the second capacitor surface is connected in electrically conductive fashion to the second web end. The first and the second capacitor surfaces are respectively capacitively coupled to a number of first counter-surfaces and second counter-surfaces. Adjustment of the adjustable capacitor element can be accomplished by making an electrically conductive connection between the first counter-surfaces and the second counter-surfaces.

14 Claims, 3 Drawing Sheets

STANDING WAVE BARRIER

BACKGROUND OF THE INVENTION

1. Field of the Invention

The present invention relates to a standing wave barrier for a radio frequency cable having a cable axis, in particular a coaxial cable, of the type having at least one metallic base web that proceeds parallel to the cable axis from a first web end to a second web end, the web ends are coupled with one another in terms of radio frequency via a capacitance, so that the base web and the capacitance together form a radio frequency resonant oscillator circuit.

2. Description of the Prior Art

Such standing wave barriers are generally known. They are used in particular in magnetic resonance installations in order to damp radio frequency disturbances (interference) in the outer shielding of coaxial cables that proceed from local coils to an evaluation device of the magnetic resonance installation.

In the prior art, it is known to wind the cable to resemble a coil having a number of windings, and to connect the ends of this coil with a capacitor in terms of radio frequency. In addition, in the prior art it is known to solder a wave trap onto the external conductor,(shielding) of the coaxial cable, and to electrically connect it at its end to the external conductor via a capacitor (e.g., again via a solder connection).

In both of these known arrangements, the cable in which the standing wave is to be damped is a component of the standing wave barrier. The standing wave barrier therefore can be completed and tuned only after being connected to the cable.

From German OS 102 11 635, a standing wave barrier is known for a radio frequency cable having a cable axis that has a hollow cylindrical Inner structure. The inner structure is electrically conductive, e.g. metallic, and proceeds parallel to the cable axis from one axial end to the other axial end of the standing wave barrier. The standing wave barrier surrounds a segment of the radio frequency cable and is capable of being displaced along the radio frequency cable. The axial ends of the standing wave barrier are coupled with one another in terms of radio frequency via a capacitance, so that the internal structure and the capacitance unit together form a radio frequency resonant oscillator circuit.

From German PC 196 27 027, a standing wave barrier for a radio frequency cable having a cable axis is likewise known. This standing wave barrier is inductively coupled to the radio frequency cable. For this purpose, it has a metallic web that proceeds parallel to the cable axis from one axial end of the web to the other axial end of the web. The web ends are coupled with one another in terms of radio frequency via a capacitance, so that the inner structure and the capacitance together form a radio frequency resonant oscillator circuit. The standing wave barrier of German PS 196 27 027 also can be displaced along the radio frequency cable.

From German Utility Model-83 18 583, a cylindrical coupling element is known that has a terminal that can be coupled inductively to the inner conductor of a coaxial cable via tile outer shielding of the coaxial cable. The coupling element is composed of two half-shells that can be connected to one another such that the radio frequency cable is clamped between them. As a result of this design, the coupling element is situated on the coaxial cable so as not to be capable of being displaced.

SUMMARY OF THE INVENTION

An object of the present invention is to provide a standing wave barrier in the a simple manner that can be completed and tuned before being connected to the cable, and in addition can be connected to the cable in a simple manner.

This object is achieved in accordance with the invention by a standing wave barrier having a base web and a capacitance situated in one of two half-shells that can be connected with one another such that the radio frequency cable is clamped between them, and wherein the capacitance includes an adjustable capacitor element that has a first capacitor surface and a second capacitor surface, the first capacitor surface being electrically conductively connected with the first web end, and the second capacitor surface being electrically conductively connected with the second web end, and wherein the first and second capacitor surfaces can be capacitively coupled respectively with a multiplicity of first and second counter-surfaces, and wherein adjustment of the adjustable capacitor element can be accomplished by an electrically conductive connection between the first counters surfaces and the second counter-surfaces, By being situated in one of the half-shells, the standing wave barrier is able to be completed and tuned self-sufficiently By being able to clamp the cable between the two half-shells, the standing wave barrier can easily be connected to the cable.

Generally, both half-shells are constructed identically, i.e., in the other half-shell there is also situated a base web having two web ends and a capacitance, which form a radio frequency resonant oscillator circuit. Identical construction of half-shells, however, is not absolutely necessary, In an embodiment wherein the capacitance also includes a non-adjustable capacitor element, a rough tuning of the oscillator circuit is already possible beforehand. Preferably, the non-adjustable capacitor element has a significantly higher capacitance than does the adjustable capacitor element.

In an embodiment the base web is situated in its half-shell so as to be open toward the radio frequency cable, so that it contacts the radio frequency cable. Formation of a contact between the base web and the radio frequency cable thus is ensured in a simple manner.

In another embodiment the half-shell with the base web has at least one additional metallic web that proceeds parallel alongside the base web, and the additional web has two web ends. A standing wave in at least one additional radio frequency cable can be damped or suppressed in a simple manner.

In a version of this embodiment the web ends of the additional web are coupled with one another in terms of radio frequency via the capacitance, so the design of the standing wave barrier is simplified by using the same capacitance to couple both webs to one another in terms of radio frequency.

In an embodiment each half-shell has a base element that is made of plastic and in which the other elements of the half-shells, in particular the base web and the capacitor unit, and the additional web (if present), are situated and held if necessary. The structural design of the standing wave barrier in this embodiment is particularly simple. The base elements can be formed as injection-molded parts, The base elements can be coated so as to be at least partially electrically conductive on their external surfaces, in particular with metallic coating. Coupling-in of disturbances via the radio frequency resonant oscillator circuit of the standing wave barrier is thereby precluded to large extent.

The half-shells can be pressed together, locked together, and/or screwed together, so the connection of the half-shells to one another is formed in an especially simple manner.

DESCRIPTION OF THE PREFERRED EMBODIMENTS

Figure 1:
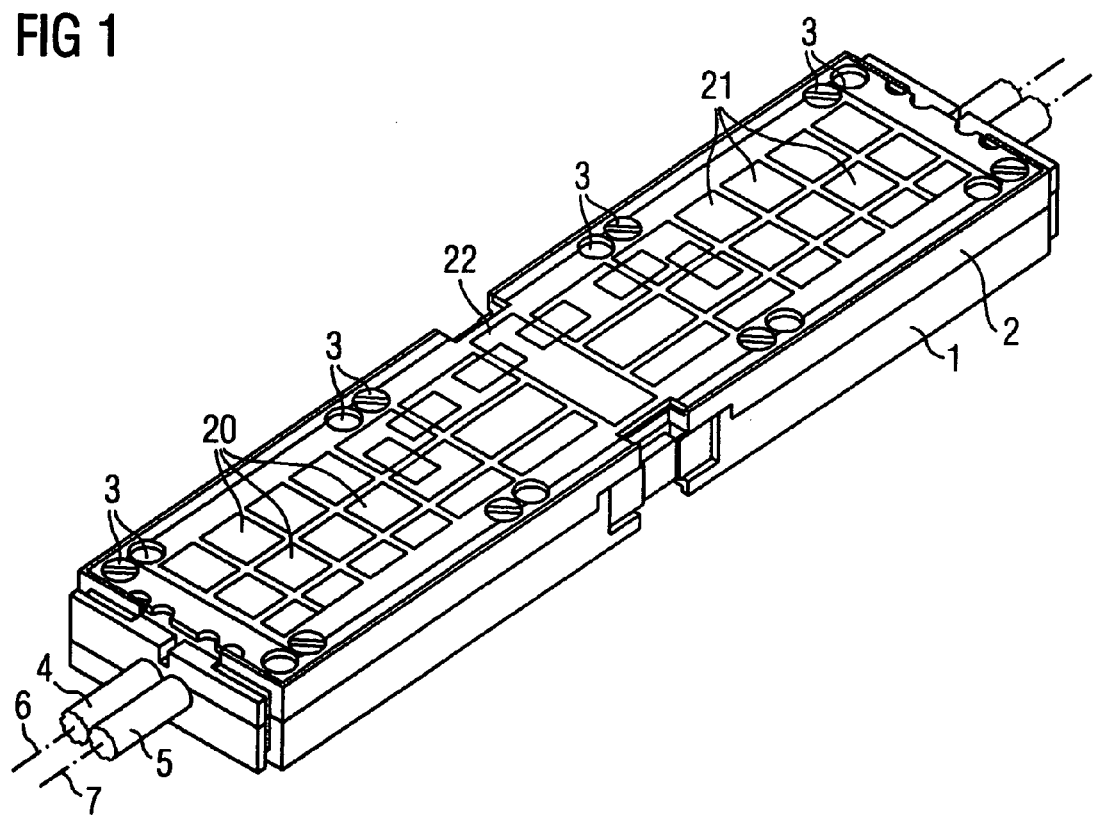
FIG. 1 shows two coaxial cables and a standing wave barrier according to the invention.

According to FIGS. 1 to 4, a standing wave barrier has two half-shells 1, 2. The half-shells 1, 2 are, for example, screwed to one another (see FIG. 4). Alternatively, or in addition they can be connected with one another by a press fit, via corresponding press pins 3. In addition, it is possible for half-shells 1, 2 to be locked to one another. The locking of half-shells 1, 2 to one another is possible as an alternative or in addition to screwing and/or pressing the half-shells 1, 2 together, In the connected state, the half-shells 1, 2 clamp between them two coaxial cables 4, 5, in which a standing wave is to be damped. The coaxial cables 4, 5 respectively have cable axes 6, 7.

The half-shells 1, 2 are of identical construction. Embodiments discussed below for one of the half-shells 1, 2 therefore apply for the other half-shell 1, 2, and vice versa.

Each half-shell 1, 2 has a base element 8 made of plastic. For example, base element 8 can be formed as an injection-molded part. The remaining elements of each half-shell 1, 2 are situated and held in the base elements 8. The remaining elements include a base web 9, an additional web 10, and a capacitance 11.

Each base element 8 is coated over a large part of its external surfaces so as to be electrically conductive. In particular, it can be metallically coated. On the basis of the large-surface electrically conductive coating, the remaining elements 9 to 11 of each half-shell 1, 2 is largely shielded against electromagnetic disturbing fields, for example the radio frequency field of a magnetic resonance installation.

The metallic base web 9 proceeds from a first web end 12 to a second web end 13. The course of base web 9 is parallel to cable axis 6. The additional web 10 proceeds parallel alongside the base web 9. It likewise has first and second web ends 14, 15.

Figure 4:
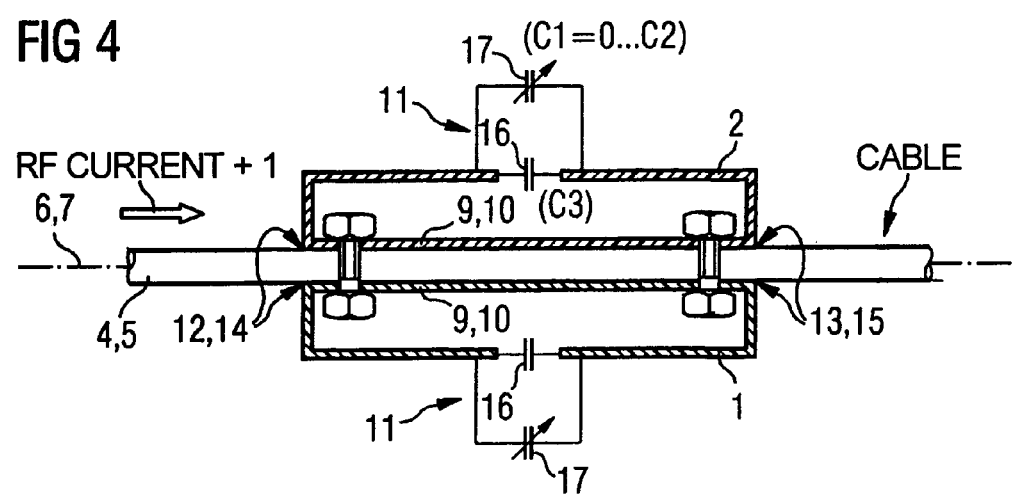
FIG. 4 schematically shows a side view of the inventive standing wave barrier.

As can be seen from FIG. 4, the respective first web ends 12, 14 of webs 9, 10 are coupled in terms of radio frequency via the capacitance 11 in radio frequency terms with second web ends 13, 15. Base web 9, additional web 10, and capacitance 11 thus together form a radio frequency resonant oscillator circuit by means of which standing waves in the coaxial cables 6, 7 are damped or suppressed. In order to achieve a good coupling to the coaxial cables 4, 5, the webs 9, 10 are situated in the half-shells 1, 2 such that they are open toward the coaxial cables 4, 5. When the coaxial cables 4, 5 are clamped between the half-shells 1, 2, the webs 9, 10 therefore contact the coaxial cables 4, 5.

Figure 2:
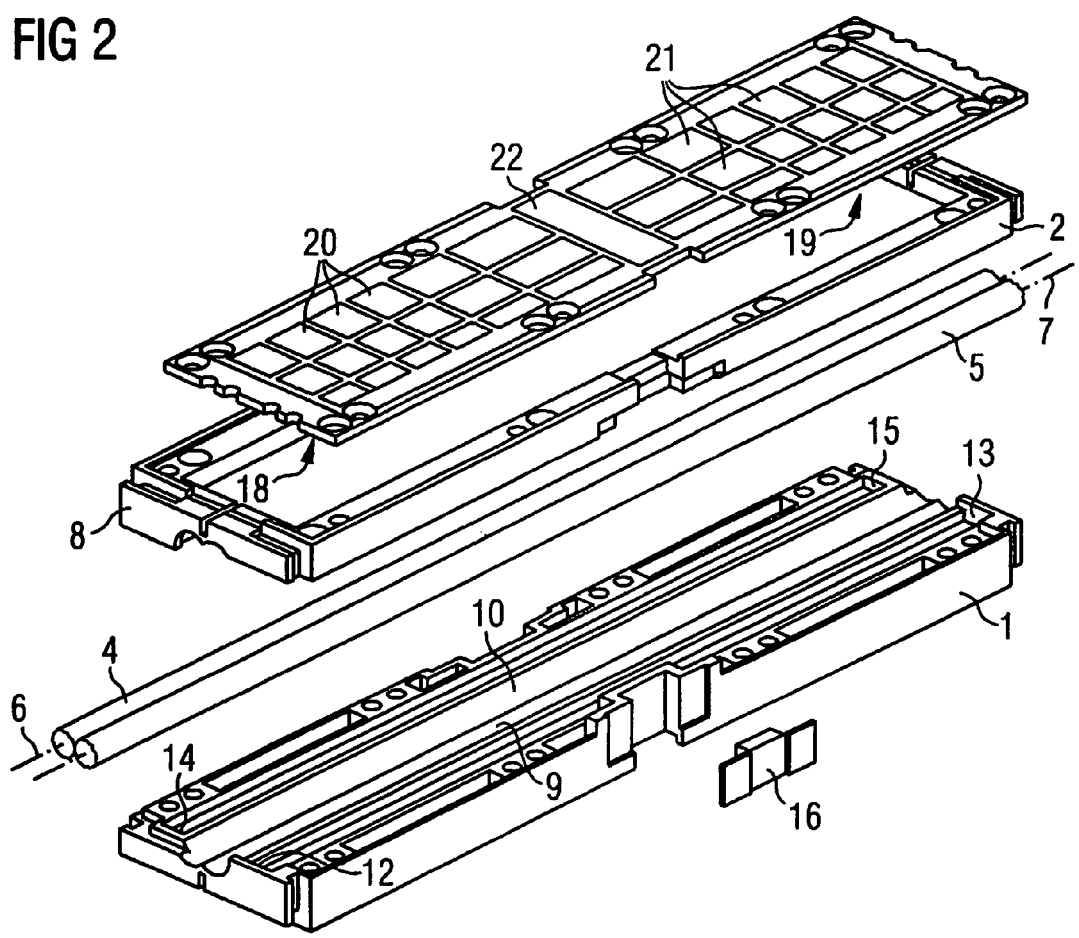
FIG. 2 shows the arrangement of FIG. 1 in an exploded view.
Figure 3:
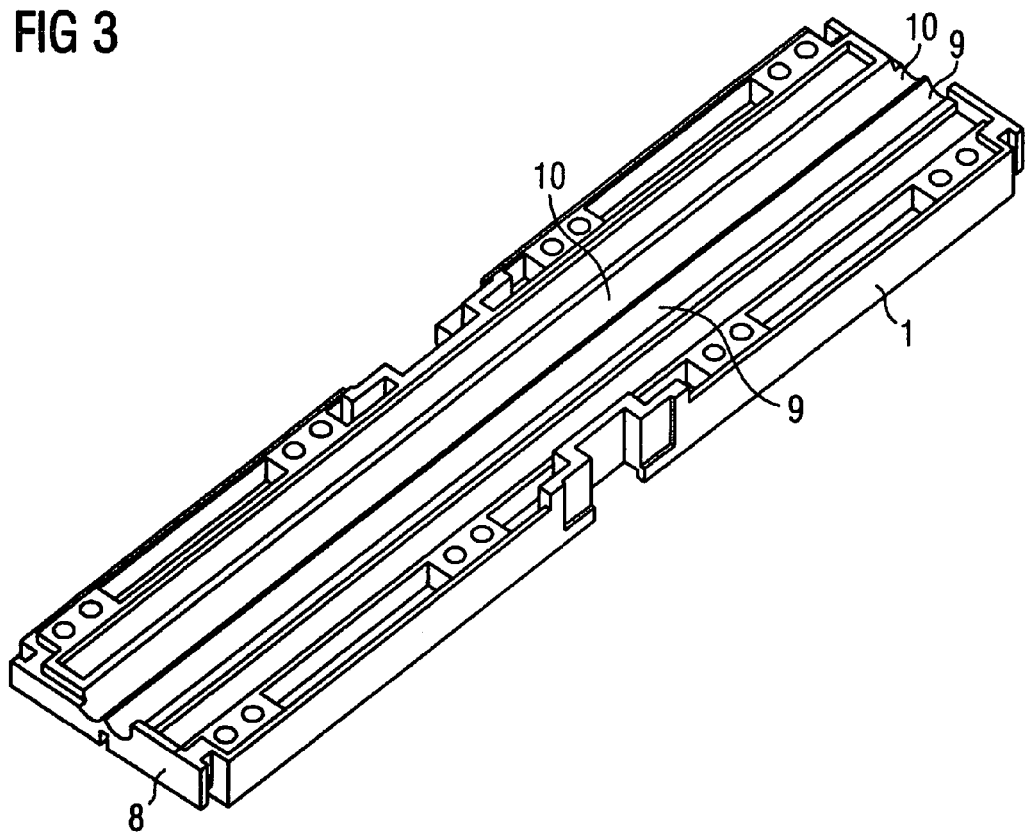
FIG. 3 shows a half-shell of the standing wave barrier of FIG. 1 and FIG. 2.

As can be seen from FIGS. 2 and 4, the capacitance 11 has a non-adjustable capacitor element 16 and an adjustable capacitor element 17.

The adjustable capacitor element 17 has (see FIG. 2) a first capacitor surface 18 and a second capacitor surface 19. The first capacitor surface 18 is connected in electrically conductive fashion with the respective first web ends 12, 14 of the webs 9, 10. The second capacitor surface 19 is connected in electrically conductive fashion with the respective second web ends 13, 15 of the webs 9, 10. The first capacitor surface 18 is (see FIGS. 1 and 2) capacitively coupled with a number of first counter-surfaces 20. Likewise, the second capacitor surface 19 is capacitively coupled with a number of second counter-surfaces 21. The capacitance C1 of the adjustable coupling element 17 is therefore dependent on which of the first counter-surfaces 20 is connected in electrically conductive fashion with the second counter-surfaces 21 directly or, as shown in FIGS. 1 and 2, via a coupling surface 22. The connection preferably is accomplished by soldered connections. The second counter-surfaces 21, connected electrically to the coupling surface 22, exhibit the same effective surface overall as the first counter-surfaces 20 connected to the coupling surface 22.

Thus, the procedure described above makes it possible to adjust the capacitance C1 of the adjustable capacitor element 17 between (practically) zero and a maximum value C2. This maximum value, however, is still significantly smaller than the capacitance C3 of the non-adjustable capacitor element 16.

The standing wave barrier according to the present invention is therefore capable of being assembled and tuned before applying it to the cables 4, 5. Afterwards, R need merely be connected to one of the coaxial cables 4, 5, or to both coaxial cables 4, 5. A subsequent tuning is not required.

Although modifications and changes may be suggested by those skilled In the art, it is the intention of the inventors to embody within the patent warranted hereon all changes and modifications as reasonably and properly come within the scope of their contribution to the art.

We claim as our invention:

1. A standing wave barrier adapted for interaction with a radio frequency cable having a cable axis, said standing wave barrier comprising:

a metallic base web having a first web end and a second web end, said metallic base web, between said first web end and said second web end, proceeding substantially parallel to said cable axis;

a capacitance connecting said first and second webs to each other in terms of radio frequency, said base web and said capacitance together forming a radio frequency resonant oscillator circuit;

first and second half-shells in which said base web and said capacitance are situated, said half-shells being connectable to each other and, when connected to each other, adapted to clamp said radio frequency cable therebetween;

said capacitance comprising an adjustable capacitor element having a first capacitor surface and a second capacitor surface, said first capacitor surface being electrically conductively connected to said first web end and said second capacitor surface being electrically conductive connected to said second wet end;

a plurality of first counter-surfaces, and a plurality of second counter-surfaces disposed at an exterior of at least one of said half-shells; and an electrically conductive connection between at least one of said first counter surfaces and at least one of said second counter surfaces that adjusts a capacitance of said adjustable capacitor element.

2. A standing wave barrier as claimed in claim 1 wherein said capacitance comprises a non-adjustable capacitor element in addition to said adjustable capacitor element.

3. A standing wave barrier as claimed in claim 2 wherein said non-adjustable capacitor element has a capacitance that is substantially higher than said capacitance of said adjustable capacitor element.

4. A standing wave barrier as claimed in claim 1 wherein said base web is disposed in one of said half shells to be open toward a location of said radio frequency cable when said two half-shells are clamped together, for adapting said base web to contact said radio frequency cable.

5. A standing wave barrier as claimed in claim 4 comprising an additional metallic web disposed in the half-shell in which said base web is disposed, said additional metallic web being disposed next to and substantially parallel to said base web.

6. A standing wave barrier as claimed in claim 5 wherein said additional metallic web has opposite web ends, and wherein said capacitance couples said opposite web ends of said additional web to each other in terms of radio frequency.

7. A standing wave barrier as claimed in claim 1 comprising a plastic base element disposed in the half-shell in which said base web and said capacitance are disposed, and said sheath wave barrier comprising a plurality of additional components situated on said plastic base element.

8. A standing wave barrier as claimed in claim 7 wherein said additional components are mounted at said base element so as to be retained at said base element.

9. A standing wave barrier as claimed in claim 7 wherein said base element is an injection-molded part.

10. A standing wave barrier as claimed in claim 7 wherein said base element has external surfaces, and comprising an electrically conductive coating covering at least a portion of said external surfaces.

11. A standing wave barrier as claimed in claim 10 wherein said coating is a metallic coating.

12. A standing wave barrier as claimed in claim 1 wherein said half shells are held together by a press fit.

13. A standing wave barrier as claimed in claim 1 wherein said half-shells are locked together.

14. A standing wave barrier as claimed in claim 1 wherein said half-shells are screwed together.

* * * * *